United States Patent
Bierhuizen et al.

(10) Patent No.: US 7,837,370 B2
(45) Date of Patent: Nov. 23, 2010

(54) LOW PROFILE SIDE EMISSION TIR LENS FOR LED

(75) Inventors: Serge Bierhuizen, Santa Rosa, CA (US); Gregory Eng, Fremont, CA (US)

(73) Assignees: Koninklijke Philips Electronics N.V., Eindhoven (NL); Philips Lumileds Lighting Company, LLC, Sano Jose, CA (US)

( * ) Notice: Subject to any disclaimer, the term of this patent is extended or adjusted under 35 U.S.C. 154(b) by 104 days.

(21) Appl. No.: 12/248,968

(22) Filed: Oct. 10, 2008

(65) Prior Publication Data

US 2010/0091498 A1 Apr. 15, 2010

(51) Int. Cl.
*F21V 7/04* (2006.01)
*H01L 33/60* (2010.01)

(52) U.S. Cl. .................. 362/555; 362/612; 362/645; 362/311.02; 257/98; 257/100; 313/512

(58) Field of Classification Search ............ 362/555, 362/612, 645, 311.02; 257/98, 100; 313/512
See application file for complete search history.

(56) References Cited

U.S. PATENT DOCUMENTS

| | | | | |
|---|---|---|---|---|
| 5,825,051 A * | 10/1998 | Bauer et al. | ............ | 257/82 |
| 6,336,825 B1 | 1/2002 | Seefried | | |
| 6,473,554 B1 | 10/2002 | Pelka et al. | | |
| 6,607,286 B2 * | 8/2003 | West et al. | ............ | 362/255 |
| 6,674,096 B2 * | 1/2004 | Sommers | ............ | 257/98 |
| 6,871,988 B2 * | 3/2005 | Gebauer et al. | ............ | 362/511 |
| 7,118,262 B2 * | 10/2006 | Negley | ............ | 362/555 |
| 7,160,010 B1 * | 1/2007 | Chinniah et al. | ............ | 362/511 |
| 7,182,497 B2 * | 2/2007 | Lee et al. | ............ | 362/555 |
| 7,254,309 B1 | 8/2007 | Chou et al. | | |
| 7,387,399 B2 * | 6/2008 | Noh et al. | ............ | 362/97.1 |
| 7,582,915 B2 * | 9/2009 | Hsing Chen et al. | ............ | 257/98 |
| 2003/0026106 A1 | 2/2003 | Knack | | |
| 2006/0034097 A1 | 2/2006 | Hahm et al. | | |
| 2006/0119250 A1 * | 6/2006 | Suehiro et al. | ............ | 313/498 |
| 2006/0126343 A1 | 6/2006 | Hsieh et al. | | |
| 2006/0273337 A1 * | 12/2006 | Han et al. | ............ | 257/98 |

OTHER PUBLICATIONS

International Search Report and Written Opinion. PCT/IB2009/054446 Filed Oct. 9, 2009.

* cited by examiner

*Primary Examiner*—Ismael Negron

(57) ABSTRACT

A low profile side-emitting lens for an LED die has two tiers of different waveguides radially extending out from a center side-emitting lens. An LED emits light into the center side-emitting lens, which has a curved surface that internally reflects the LED light outward approximately parallel to the top surface of the LED die. The center lens has a height of 2 mm, required for reflecting the LED light outward. Radially extending from the periphery of the bottom half of the center lens is a bottom tier of waveguides, each having a height of 1 mm, and radially extending from the periphery of the top half of the center lens is a top tier of waveguides, each having a height of 1 mm. The light output areas of the top and bottom tiers of waveguides are parallel with each other so that the 2 mm high side emission is reduced to a 1 mm side emission without reducing the emission area.

17 Claims, 4 Drawing Sheets

LOW PROFILE SIDE EMISSION TIR LENS FOR LED

FIELD OF THE INVENTION

This invention relates to lenses for light emitting diodes (LEDs) and, in particular, to a very low profile lens for side-emission.

BACKGROUND

LED dies typically emit light over a very wide angle, typically up to 90 degrees off its center axis, the center axis being normal to the major surface of the LED die. For some applications, such as for coupling light into a thin rectangular waveguide for backlighting a thin liquid crystal display (LCD), the LED is provided with optics to cause it to only emit light generally perpendicular to its center axis within a low angle. In such a case, the LED's major surface is parallel to the emission surface of the waveguide, and the entire light emitting portion of the side-emitting lens is within the waveguide or optically coupled to a side of the waveguide.

FIG. 1 is a side view of one such prior art side-emitting LED structure 10. The LED die 12 is mounted on a submount 14, which has top electrodes contacting bottom electrodes on the LED die 12. The submount top electrodes are typically connected by leads or vias to robust terminals on the top, side, or bottom of the submount 14 for connection to a circuit board for supplying power to the LED die 12. A phosphor layer (not shown) may be formed over the LED die 12 to convert the LED emission into a different wavelength to achieve any of a variety of colors. A reflective layer 16, such as a metal layer, is formed over the top of the LED die 12 to block light from exiting normal to the LED die's major surface and to reflect essentially all light either back into the LED die 12 or out the sides.

The side-emitting LED structure of FIG. 1 has at least the following drawbacks when using it to supply light to a thin waveguide for backlighting. The structure has an undesirable wide angle side light emission, as illustrated by some light rays exiting the side at approximately 90°. The mirror 16 reflects light back into the LED die 12, which results in multiple internal reflections before the light exists the sides, where each reflection attenuates the light. The mirror 16 is not 100% reflective. And, forming a reflective layer is a complicated step.

Providing a side-emission lens over the LED die that uses total internal reflection (TIR), instead of a reflective layer 16, to direct the light parallel to the LED die's major surface avoids the above-described drawbacks. However, such a lens increases the thickness of the LED structure to well over 1 mm. The side-emitting light cannot be efficiently coupled into a waveguide whose thickness is less than the height of the side emission.

FIG. 2 is a cross-sectional view of a prior art side-emitting lens 20 that uses TIR. Various light rays are shown being emitted from the side of the lens. Such a lens is described in U.S. Pat. No. 6,473,554, incorporated herein by reference. The lens is circular and symmetrical about its center axis. Since the LED die 12 has a width generally between 0.6-1.5 mm, and the inner angles of the lens 20 must generally reflect the light parallel to the top surface of the LED die 12, the required height of the lens 20 is dictated by physics and is necessarily greater than 1 mm. For an LED of approximately 1 mm width, the required height of the lens 20 is at least 2 mm. Increasing the diameter of the lens 20 reduces the light emission angle since more of the LED light will be reflected sideways by the top surface of the lens 20.

The lens 20 could not be used to efficiently couple light into a 1 mm thick waveguide.

There are many small consumer devices that require a small backlit display. Reducing the thickness of such displays is a goal, and one way to reduce the thickness of the display is to reduce the thickness of the backlight waveguide. It would be desirable to create a side-emitting LED structure that could efficiently couple light into a thin waveguide, such as a 1 mm waveguide.

SUMMARY

In one embodiment of the invention, a low profile side-emitting lens for an LED die has two tiers of different waveguides. A center portion of the lens has a vortex shape with a cusp facing the center of the LED die. The inner angles of the vortex shape internally reflect LED light generally parallel to the top face of the LED die. The central vortex portion has a height of about 2 mm in one embodiment. Accordingly, light will be emitted from the periphery of the central vortex portion as a 2 mm high, 360° ring of light.

Radially extending from the periphery of the bottom half of the central vortex portion is a bottom tier of rectangular waveguides, each having a constant thickness of 1 mm, that guide all light emitted from the bottom half of the central vortex portion to light output areas of the bottom tier of waveguides. Radially extending from the periphery of the top half of the central vortex portion is a top tier of waveguides, each having a constant thickness of 1 mm, that guide all light emitted from the top half of the central vortex portion to light output areas of the top tier of waveguides. Each of the top tier waveguides has a downward angle portion so that the light output areas of the top tier of waveguides are in the same plane as the light output areas of the bottom tier of waveguides. Therefore, the 2 mm high side emission output from the central vortex portion is reduce to a 1 mm side emission by the combination of the top and bottom tiers of waveguides. All light from the LED die is efficiently shaped into a very thin 360° ring having a height of 1 mm or less. Of course, other heights of the light emission are obtainable.

The above-described technique reduces the side-emission height of the prior art lens of FIG. 2 by one-half.

A larger diameter of the side-emitting lens reduces the emission cone angle. Typically diameters will be between 0.5 cm and 3 cm.

In another embodiment, the top and bottom tiers of waveguides are not rectangular but are wedge shaped so that the outer periphery of the side-emitting lens has no gaps between the waveguides.

No reflective layer (e.g., a metal layer) is needed to be formed over the LED die or over the waveguides since all reflection is accomplished by TIR.

The LED may have a phosphor layer so that the side-emitting lens emits white light for coupling into a 1 mm waveguide for an LCD backlight. The LED structure may be inserted into a hole formed in the waveguide to optically couple the light into the waveguide.

BRIEF DESCRIPTION OF THE DRAWINGS

Elements identified by the same numeral in the various figures are the same or similar.

DETAILED DESCRIPTION

Figure 6:
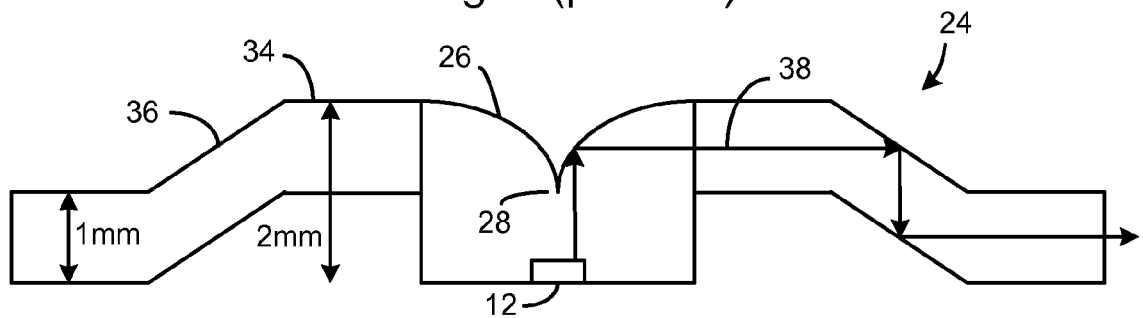
FIG. 6 is cross-sectional view of the lens of FIG. 3 taken across the line 6-6 of FIG. 3.
Figure 7:
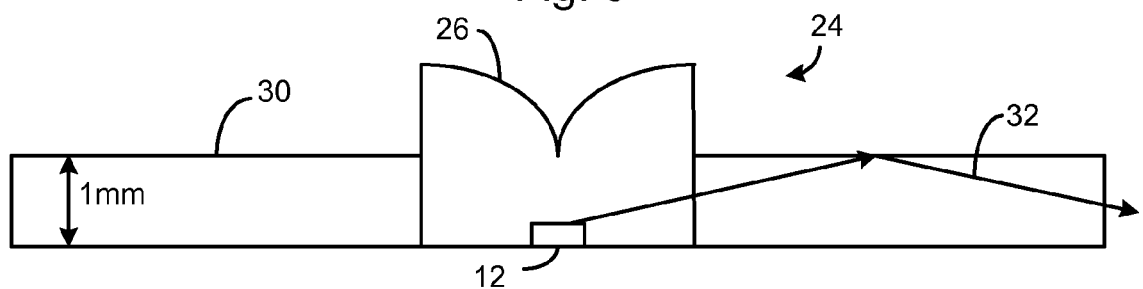
FIG. 7 is a cross-sectional view of the lens of FIG. 3 taken across the line 7-7 of FIG. 3.
Figure 3:
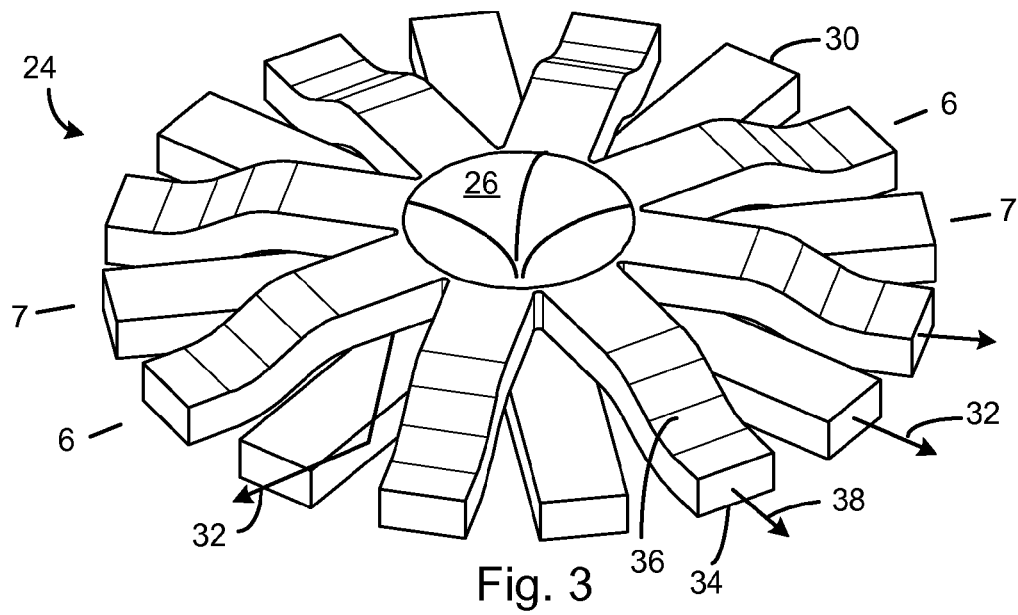
FIG. 3 is a top perspective view of one embodiment of the low profile side-emitting lens in accordance with one embodiment of the invention.
Figure 4:
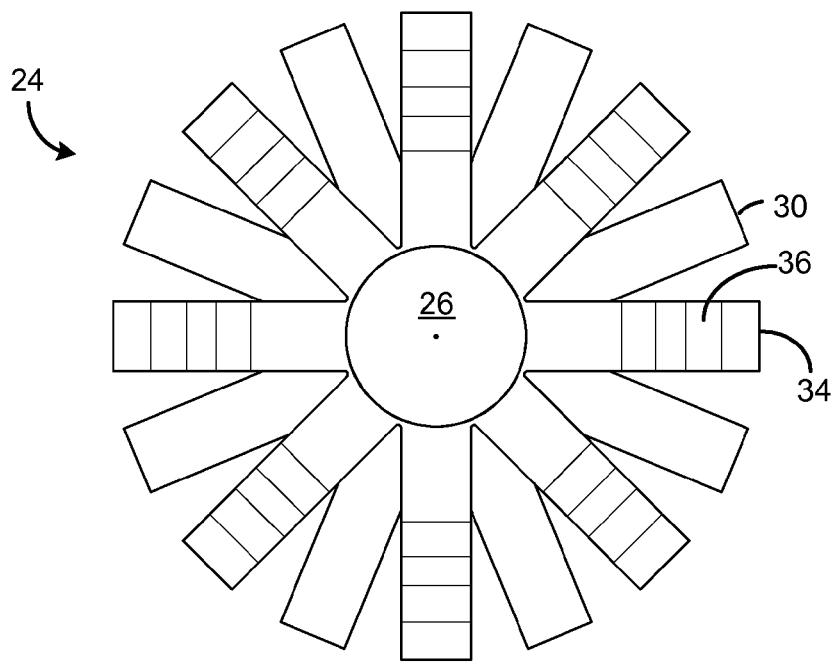
FIG. 4 is a top view of the lens of FIG. 3.
Figure 5:
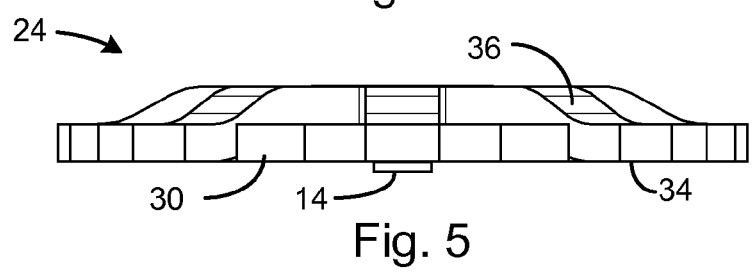
FIG. 5 is a side view of the lens of FIG. 3.

FIG. 3 illustrates one-embodiment of the side-emitting lens 24. FIGS. 4 and 5 are different views of the lens 24. FIG. 6 is a cross-section along line 6-6 in FIG. 3, and FIG. 7 is a cross-section along line 7-7 in FIG. 3. FIG. 5 shows a portion of a submount 14 or circuit board extending below the lens 24.

As shown in FIGS. 6 and 7, a center portion 26 of the lens has a symmetrical vortex shape with a downward cusp 28 centered over the LED die 12 so that the curved surface of the vortex shape internally reflects substantially all the impinging light generally sideways due to the LED light impinging on the lens surface at greater than the critical angle. There may be some leakage of light through the center portion 26, but such leakage should be less than 10% of the total light emitted by the major surface of the LED die 12. The outer wall of the center portion 26 is cylindrical.

Figure 1:
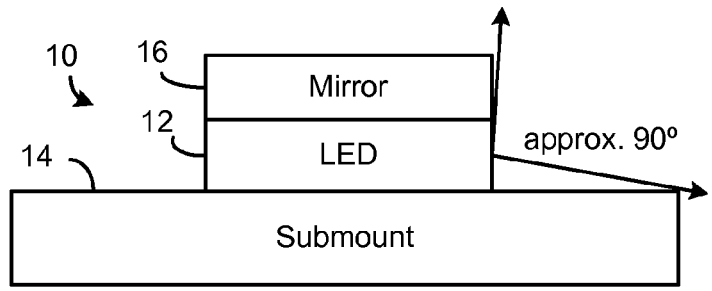
FIG. 1 is a side view of a simple prior art side-emitting LED structure.
Figure 2:
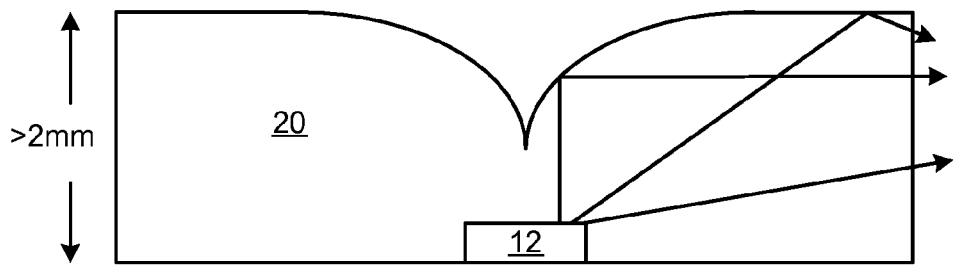
FIG. 2 is a cross-sectional view of a prior art side-emitting lens that uses TIR.

The die 12 may be mounted on a submount, such as submount 14 in FIG. 1, which may in turn be mounted on a circuit board. The center portion 26 may be silicone, a polymer, or other transparent material molded over the LED die 12 to encapsulate the LED die 12. By encapsulating the LED die 12 with an overmolded center portion 26 formed of a high index of refraction silicone, there is good light coupling into the center portion 26.

In the embodiment shown in FIGS. 3-7, the light exit height of the center portion is 2 mm, and its diameter is about 5 mm. Other dimensions may also be used, depending on the size of the LED die 12. Larger width LED dies would require a thicker center portion 26 to achieve the required curvature of the inner surface of the vortex for suitable TIR. The sidelight is typically emitted from the central portion 26 within a 30° angle, determined by the angle where the light is half the brightness as the light at a 0° angle. Light within such an angle is considered to be substantially perpendicular to the major surface of the LED die since the brightest portion of the reflected light is within a narrow range near the 0° angle.

Accordingly, in the example, light will exit the outer cylindrical wall of the center portion 26 as a 2 mm thick ring at a narrow angle. The larger the diameter of the center portion, the narrower the angle.

A radial array of rectangular waveguides 30, 1 mm in thickness, is then formed around the bottom half of the center portion 26, forming a bottom tier of waveguides. The waveguides 30 may be formed by molding directly onto the center portion 26 or separately formed and fitted over the central portion 26. There may even be a small air gap between the center portion 26 and the waveguides 30. All light emitted by the bottom half of the center portion 26 is optically coupled into the waveguides 30, and the waveguides 30 direct such light out the ends of each of the waveguides 30, as shown by the light rays 32 in FIGS. 3 and 7. The waveguides 30 would typically be of the same transparent material used to form the center portion 26. Eight waveguides 30 are shown in the example for the bottom tier of waveguides, however, there may be more or fewer.

A second radial array of waveguides 34, having a constant thickness of 1 mm, is then formed around the upper half of the center portion 26, forming a top tier of waveguides. A downward angled portion 36 guides all light emitted from the top half of the center portion 26 to be in the same plane as the light output from the bottom tier of waveguides 30. Such light guiding is illustrated by the light rays 38 in FIGS. 3 and 6. The waveguides 34 would typically be of the same transparent material used to form the center portion 26. The waveguides 34 may be formed by molding directly onto the center portion 26 or separately formed and fitted over the central portion 26. There may even be a small air gap between the center portion 26 and the waveguides 34. Eight waveguides 34 are shown in the example to fill in between the bottom tier of waveguides 30. The number of top tier waveguides 34 will be the same as the number of bottom tier waveguides 30.

The height of the side-emitting lens 24 at the output of the waveguides 30/34 is only 1 mm, so that all light may be efficiently coupled into a backlight waveguide having a thickness of 1 mm or more. The total emission area of the 2 mm high cylindrical wall of the center portion 26 is the same as the total emission area of the 1 mm high waveguides 30/34. Increasing the diameter of the side-emitting lens 24 narrows the emission cone angle to produce a "flatter" 360° light ring.

Figure 8:
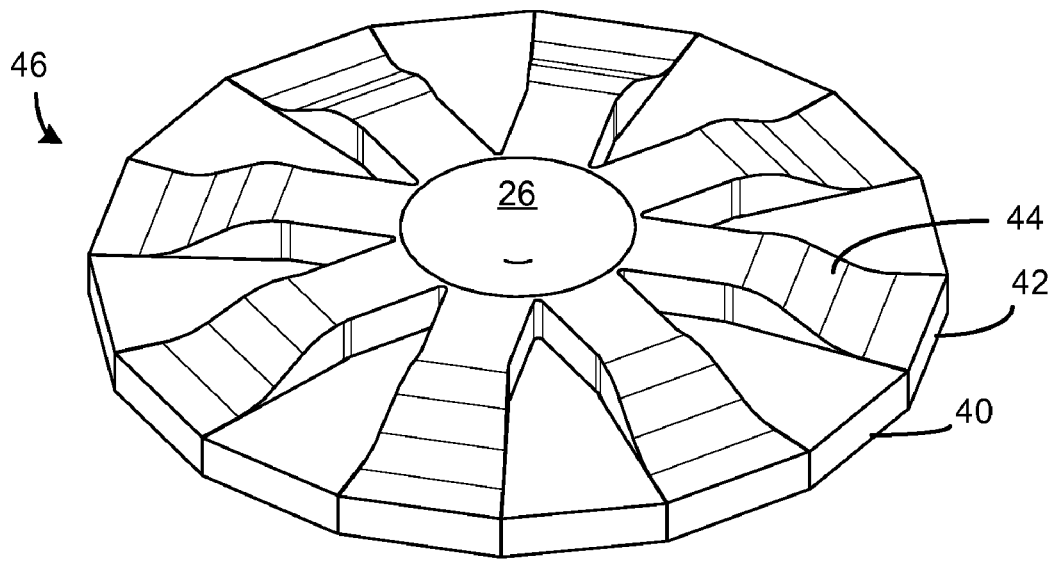
FIG. 8 is a top perspective view of another embodiment of the low profile side-emitting lens.
Figure 9:
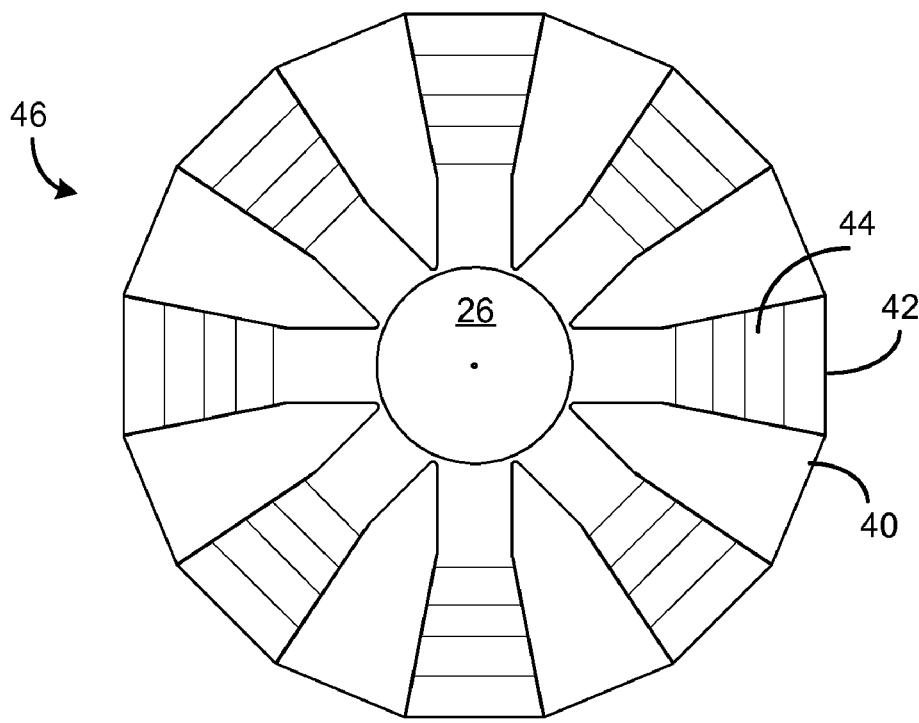
FIG. 9 is a top view of the lens of FIG. 8.
Figure 10:
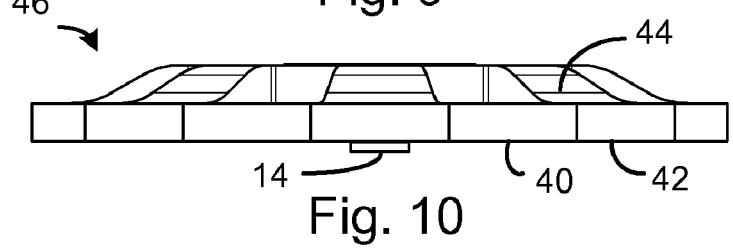
FIG. 10 is a side view of the lens of FIG. 8.

To avoid any dark areas between the light output areas of the waveguides 30 and 34, the waveguides may be wedge shaped, as shown in FIGS. 8-10. In such a case, the light output area is larger than the emission area of the center portion 26. FIG. 8 illustrates the bottom tier of waveguides 40 and the top tier of waveguides 42, where the waveguides 42 have a downward angled portion 44. The operation is the same as that described with respect to FIGS. 3-7. The height of the output of the side-emitting lens 46 of FIGS. 8-10 (e.g., 1 mm) is about half the height of the center portion 26. The lens 46 may be manufactured in the same way as the lens 24 of FIGS. 3-7.

With LED dies having widths smaller than about 1 mm, the light exit height of the center portion 26 may be less than 2 mm, and the side-emitting waveguides can have an output height less than 1 mm.

Since, in both embodiments, the total light output area of the waveguides is greater than or equal to the light output area of the center portion 26, the etendue of the center portion 26 is less than or equal to the etendue of the waveguides, so there is no loss resulting from mismatched etendues. Generally, the optical technique described herein reduces the height of a source light emission without reducing the light output area, while only using TIR.

Figure 11:
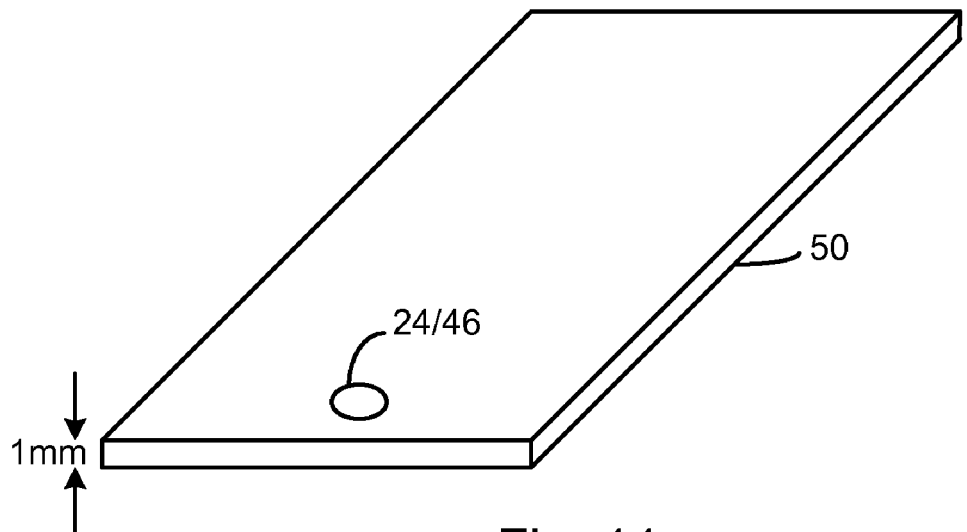
FIG. 11 is a perspective view of a 1 mm polymer waveguide, for backlighting a small LCD, containing the LED and side-emitting lens of the present invention.

Although the side-emitting lens can be used for many purposes, an important purpose is for coupling the side light into a waveguide. FIG. 11 illustrates a transparent polymer waveguide 50, having a thickness of 1 mm. The side-emitting lens 24 or 46 is shown inserted into a hole in the waveguide 50. The ends of the waveguides 30/34 in the side-emitting lens may abut the inner wall of the hole in the waveguide 50 or there may be a small air gap. The center portion 26 of the lens would extend above or below the waveguide 50 if the height of the center portion 26 were greater than the thickness of the waveguide 50. The waveguide 50 may contain angled reflectors (or be roughened) on its bottom surface to redirect all light toward its top face. In this way, the top face of the waveguide 50 emits uniform light for backlighting an LCD. The waveguide 50 may instead be used for general illumination or for some other purpose.

Figure 12:
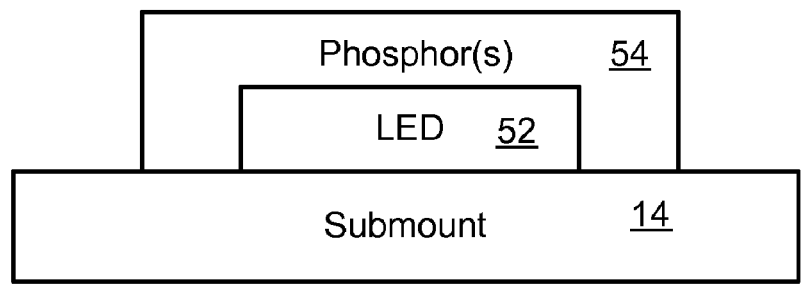
FIG. 12 is a cross-sectional view of a prior art blue or UV LED die having a phosphor coating to produce light of any color, such as white, which may be used with the side-emitting lens.

FIG. 12 is a cross-sectional view of an LED structure that may be overmolded by the side-emitting lens. The LED die 52, mounted on a submount 14, may emit blue or UV light. A phosphor 54, such as YAG or any combination of red, green, or blue phosphors, covers the LED die 52 so the resulting light emission can be white or any other color. In another embodiment, no phosphor is used or the phosphor is remotely located, such as on the lens or external to the lens.

Figure 13:
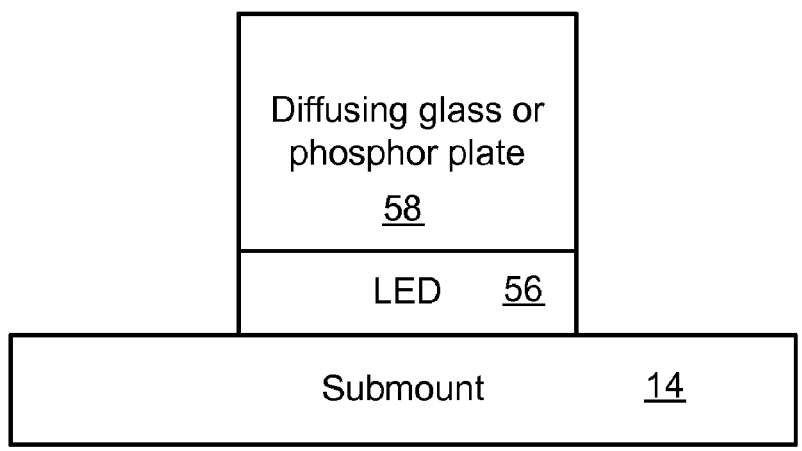
FIG. 13 is a cross-sectional view of an LED die having a diffusing glass plate or a phosphor plate, which may be used with the side-emitting lens.

FIG. 13 is a cross-sectional view of another LED structure that may be overmolded by the side-emitting lens. The LED die 56, mounted on a submount 14, may emit blue or UV light. A diffusing glass plate or a phosphor plate 58 is then affixed to the top surface of the LED die 56 to diffuse and/or change the output wavelength.

In one embodiment, the LED die has its growth substrate removed and has a thickness less than 10 microns. Any phosphor or diffusing glass over the LED may be less than 0.5 mm thick. The typical thickness range of the LED should not affect the thickness of the side-emitting lens, which is preferably molded over the LED.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light system comprising:
    a light emitting diode (LED), the LED having a major surface that emits light;
    a first optical element over the LED, the first optical element having a curved surface such that a majority of the light emitted by the major surface is redirected by total internal reflection (TIR) in a direction that is substantially parallel to the major surface, wherein substantially all light emitted from the first optical element is through a first surface area of the first optical element, the first surface area having a first height in a direction substantially perpendicular to the major surface; and
    a second optical element optically coupled to the first optical element to receive substantially all light emitted through a first section of the first surface area of the first optical element, the second optical element having a light output area of a second height substantially less than the first height, wherein a majority of light emitted by the light output area is in a direction substantially parallel to the major surface of the LED, and wherein the light output area of the second optical element has a second surface area approximately equal to or greater than the first surface area.

2. The system of claim 1 wherein the first optical element comprises a symmetrical circular body having a substantially cylindrical side wall through which light exits the first optical element, a top surface of the first optical element having a cusp and a vortex shape, wherein the LED major surface is substantially centered below the cusp, wherein the top surface reflects LED light by TIR in a direction that is substantially parallel to the major surface.

3. The system of claim 1 wherein the second height is approximately one-half of the first height.

4. The system of claim 1 wherein the second height is approximately 1 mm or less.

5. The system of claim 1 wherein the second optical element comprises a plurality of waveguides arranged around the first optical element.

6. The system of claim 1 wherein the second optical element emits light in a ring pattern.

7. A light system comprising:
    a light emitting diode (LED), the LED having a major surface that emits light;
    a first optical element over the LED, the first optical element having a curved surface such that a majority of the light emitted by the major surface is redirected by total internal reflection (TIR) in a direction that is substantially parallel to the major surface, wherein substantially all light emitted from the first optical element is through a first surface area of the first optical element, the first surface area having a first height in a direction substantially perpendicular to the major surface; and
    a second optical element optically coupled to the first optical element to receive substantially all light emitted through a first section of the first surface area of the first optical element, the second optical element having a light output area of a second height substantially less than the first height, wherein a majority of light emitted by the light output area is in a direction substantially parallel to the major surface of the LED, and wherein the light output area of the second optical element has a second surface area approximately equal to or greater than the first surface area,
    wherein the second optical element comprises:
        a plurality of first waveguides, each of the first waveguides having a light input end and a light output end, the plurality of first waveguides being arranged radially around the first optical element so that the light input end of each of the first waveguides is optically coupled to receive light from only the first section of the first surface area of the first optical element; and a plurality of second waveguides, each of the second waveguides having a light input end and a light output end, the plurality of second waveguides being arranged radially around the first optical element so that the light input end of each of the second waveguides is optically coupled to receive light from only a second section of the first surface area of the first optical element, wherein the light output ends of the first waveguides and the second waveguides are in a same first plane, and wherein the light input ends of the first waveguides and the second waveguides are in different planes.

8. The system of claim 7 wherein the first optical element comprises a symmetrical circular body having a substantially cylindrical side wall through which light exits the first optical element, a top surface of the first optical element having a cusp and a vortex shape, wherein the LED major surface is substantially centered below the cusp, wherein the top surface reflects LED light by TIR in a direction that is substantially parallel to the major surface, and
    wherein the first section of the first surface area of the first optical element is a first half of the substantially cylindrical side wall, and the second section of the first surface area of the first optical element is a second half of the substantially cylindrical side wall.

9. The system of claim 7 wherein the first waveguides and the second waveguides have rectangular cross-sections.

10. The system of claim 7 wherein the first waveguides are rectangular.

11. The system of claim 7 wherein the second waveguides have an angled portion that redirects light entering at an input plane to exit from the second waveguides in the first plane different from the input plane.

12. The system of claim 7 wherein the light input ends of the first waveguides are in the first plane, and the light input ends of the second waveguides are in a second plane different from the first plane.

13. The system of claim 7 wherein the first waveguides are wedge-shaped.

14. The system of claim 7 wherein the second waveguides are wedge-shaped with an angled portion that redirects light entering at an input plane to exit from the second waveguides in the first plane different from the input plane.

15. The system of claim 7 wherein the first waveguides and the second waveguides overlap where the first waveguides and second waveguides are optically coupled to the first optical element.

16. The system of claim 7 wherein the second height is approximately one-half of the first height.

17. The system of claim 7 wherein the second height is approximately 1 mm or less.

* * * * *